United States Patent
Kajigaya

(10) Patent No.: US 9,892,784 B2
(45) Date of Patent: Feb. 13, 2018

(54) SEMICONDUCTOR DEVICE AND ERROR CORRECTION METHOD

(71) Applicant: Micron Technology, Inc., Boise, ID (US)

(72) Inventor: Kazuhiko Kajigaya, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/399,572

(22) Filed: Jan. 5, 2017

(65) Prior Publication Data

US 2017/0117044 A1 Apr. 27, 2017

Related U.S. Application Data

(62) Division of application No. 14/480,325, filed on Sep. 8, 2014, now Pat. No. 9,558,063.

(30) Foreign Application Priority Data

Sep. 9, 2013 (JP) .................................. 2013-186214

(51) Int. Cl.
*G11C 13/00* (2006.01)
*G06F 11/10* (2006.01)
*G11C 29/52* (2006.01)

(52) U.S. Cl.
CPC ...... *G11C 13/0069* (2013.01); *G06F 11/1068* (2013.01); *G11C 13/004* (2013.01); *G11C 13/0028* (2013.01); *G11C 29/52* (2013.01); *G11C 2013/0054* (2013.01)

(58) Field of Classification Search
CPC ............ G11C 13/0069; G11C 13/0028; G11C 13/004; G11C 29/52; G06F 11/1068
See application file for complete search history.

(56) References Cited

U.S. PATENT DOCUMENTS

| | | | |
|---|---|---|---|
| 4,730,320 A | 3/1988 | Hidaka et al. | |
| 6,332,206 B1 | 12/2001 | Nakatsuji et al. | |
| 6,351,412 B1 | 2/2002 | Nozoe et al. | |
| 6,430,723 B2 | 8/2002 | Kodama et al. | |
| 6,453,441 B1 | 9/2002 | Daoudi et al. | |
| 7,433,246 B2 | 10/2008 | Lee | |
| 7,574,648 B2 | 8/2009 | Akiyama et al. | |
| 7,688,617 B2 | 3/2010 | Sakimura et al. | |
| 7,793,197 B2 | 9/2010 | Ito et al. | |
| 7,872,911 B2 * | 1/2011 | Sarin .................. | G11C 11/5628 365/185.03 |

(Continued)

FOREIGN PATENT DOCUMENTS

| | | |
|---|---|---|
| JP | 05-136361 | 6/1993 |
| JP | 2002-222589 | 8/2002 |

*Primary Examiner* — Esaw T Abraham
(74) *Attorney, Agent, or Firm* — Dorsey & Whitney LLP

(57) ABSTRACT

A device with error correction is provided. The device includes a plurality of memory cells, and reference read write circuit, a plurality of sense amplifiers, and an error-correction code control block. The reference read write circuit is configured to generate a reference voltage in response to data stored in at least one of the plurality of memory cells. A plurality of sense amplifiers are each coupled to a respective memory cell of the plurality of memory cells. An error-correction code (ECC) control block may output an error signal when the ECC control block detects that it is unable to correct error data in one or more respective memory cells. The reference read write circuit may overwrite data in the at least one of the plurality of memory cells in response to the error signal.

20 Claims, 10 Drawing Sheets

(56) References Cited

U.S. PATENT DOCUMENTS

| | | | |
|---|---|---|---|
| 7,936,588 B2* | 5/2011 | Liu | G11C 11/1673 |
| | | | 365/100 |
| 7,975,209 B2* | 7/2011 | Chin | G06F 12/0246 |
| | | | 375/262 |
| 8,000,134 B2 | 8/2011 | Cornwell et al. | |
| 8,281,221 B2 | 10/2012 | Sakimura et al. | |
| 8,312,348 B2 | 11/2012 | Yamaga | |
| 8,355,291 B2* | 1/2013 | Kim | G11C 13/0004 |
| | | | 365/148 |
| 8,503,218 B2* | 8/2013 | Kim | G11C 5/063 |
| | | | 365/148 |
| 8,510,633 B2 | 8/2013 | Sakimura et al. | |
| 8,743,632 B2* | 6/2014 | Kim | G11C 5/147 |
| | | | 365/148 |
| 9,093,145 B2* | 7/2015 | Oh | G11C 13/004 |
| 9,558,063 B2 | 1/2017 | Kajigaya et al. | |
| 2001/0052090 A1 | 12/2001 | Am | |
| 2004/0165419 A1 | 8/2004 | Tsuji | |
| 2007/0198904 A1 | 8/2007 | Yoshida | |
| 2007/0297223 A1 | 12/2007 | Chen et al. | |
| 2009/0141544 A1 | 6/2009 | Sakimura et al. | |
| 2010/0046274 A1 | 2/2010 | Tsuchida et al. | |
| 2011/0016371 A1 | 1/2011 | Sakimura et al. | |
| 2011/0173513 A1 | 7/2011 | DeBrosse et al. | |
| 2011/0289386 A1 | 11/2011 | Yang | |
| 2013/0314979 A1 | 11/2013 | Lee | |
| 2014/0071739 A1 | 3/2014 | Kim et al. | |
| 2015/0074493 A1 | 3/2015 | Kajigaya | |
| 2015/0146481 A1 | 5/2015 | Lin | |
| 2015/0318033 A1 | 11/2015 | Kajigaya | |

* cited by examiner

ND ERROR
SEMICONDUCTOR DEVICE AND ERROR CORRECTION METHOD

CROSS-REFERENCE TO RELATED APPLICATION(S)

This application is a divisional of U.S. patent application Ser. No. 14/480,325, filed Sep. 8, 2014, issued as U.S. Pat. No. 9,558,063 on Jan. 31, 2017, which claims the benefit of Japanese Application No. 2013-186214, filed on Sep. 9, 2013. Both applications and patent are hereby incorporated by reference, in their entirety, for any purpose.

The present invention relates to a semiconductor device that corrects errors in data read from a memory cell, and to an error correction method thereof.

BACKGROUND

At present, flash memory is widely used as a non-volatile semiconductor memory device, but with the aim of replacing flash memory, there is progress in the development of various types of semiconductor memory device. These include resistance variable memory cells, where resistance variable elements are used to store information of logic 0 and logic 1 according to resistance value. A representative variable resistance element may be an STT-RAM (Spin Transfer Torque-Random Access Memory) that performs spin injection magnetization reversal writing using a magnetic tunnel junction (MTJ) element, or a Re-RAM (Resistive-Random Access Memory) that uses a metal oxide or the like.

In order to perform sense-amplification of signals read from these resistance variable memory cells, a method using reference cells is generally employed. A reference cell method may be a method of generating a reference signal (reference voltage or reference current) using a memory cell that has an intermediate resistance value between two resistance values respectively corresponding to logic 0 and logic 1, or a method of using two memory cells having resistance values corresponding respectively to logic 0 and logic 1, and generating a reference signal equivalent to an intermediate resistance value thereof.

JP Patent Kokai Publication No. 2009-211742A (Patent Literature 1) discloses an error correction device and an error correction method which, in a case of error exceeding data error correction capability in data that is read from a non-volatile memory, can prevent the addition of further error.

JP Patent Kokai Publication No. 2006-244541A (Patent Literature 2) discloses a semiconductor memory device provided with an error correction circuit that uses ECC (Error Correction Code) corresponding to a sense amplifier of a DRAM. In the semiconductor memory device, when there is an error in sense-amplified data at a stage when a page is open, the error is corrected. Check bit information is then generated at a stage when the page is closed, and rewriting thereof is performed along with data bits.

The following analysis is given from a viewpoint of the present invention.

In a case of using a reference cell method in a semiconductor memory device, in order to reduce a size of the device and save cost, the number of reference cells may be reduced, and one reference cell may be shared by a plurality of sense amplifiers. In such a case, if an error exists in a reference cell, a plurality of data amplified based on the reference cell will have errors too. These errors are problems for a semiconductor device adopting the reference cell.

SUMMARY

According to a first aspect of the present invention, there is provided a semiconductor device comprising: a memory cell array including a plurality of first memory cells, a plurality of second memory cells, and one or more third memory cells; a judging circuit that judges a plurality of data values held by selected first memory cells of the plurality of first memory cells and selected second memory cells of the plurality of second memory cells, by referring to a reference signal corresponding to reference data held by selected at least one of third memory cells; and an error detection and correction circuit that detects whether or not there is an error in the judged data values of the plurality of first and/or second memory cells, with the judged data value of the plurality of first and second memory cells as an error correcting code. Here, the error detection and correction circuit, on detecting that there is an error exceeding error correction capability in the judged data values of the plurality of first and/or second memory cells, performs control to write the reference data to the selected at least one of third memory cells.

According to a second aspect of the present invention, there is provided an error correction method for a memory cell array including a plurality of first memory cells, a plurality of second memory cells, and one or more third memory cells that hold reference data, the method including the following steps. Namely, the error correction method includes a judging step of judging a plurality of data values held by selected first memory cells of the plurality of first memory cells and selected second memory cells of the plurality of second memory cells, by referring to a reference signal corresponding to reference data held by selected at least one of third memory cells. The error correction method includes a detecting step of detecting whether or not there is an error exceeding error correction capability in the judged data values of the plurality of first and/or second memory cells, with the judged data value of the plurality of first and second memory cells as an error correcting code. In addition the error correction method includes a reference data writing step of writing the reference data, in a case of detecting that there is an error exceeding error correction capability in the judged data values of the plurality of first and/or second memory cells, to the selected at least one of third memory cells.

PREFERRED MODES

Figure 1:
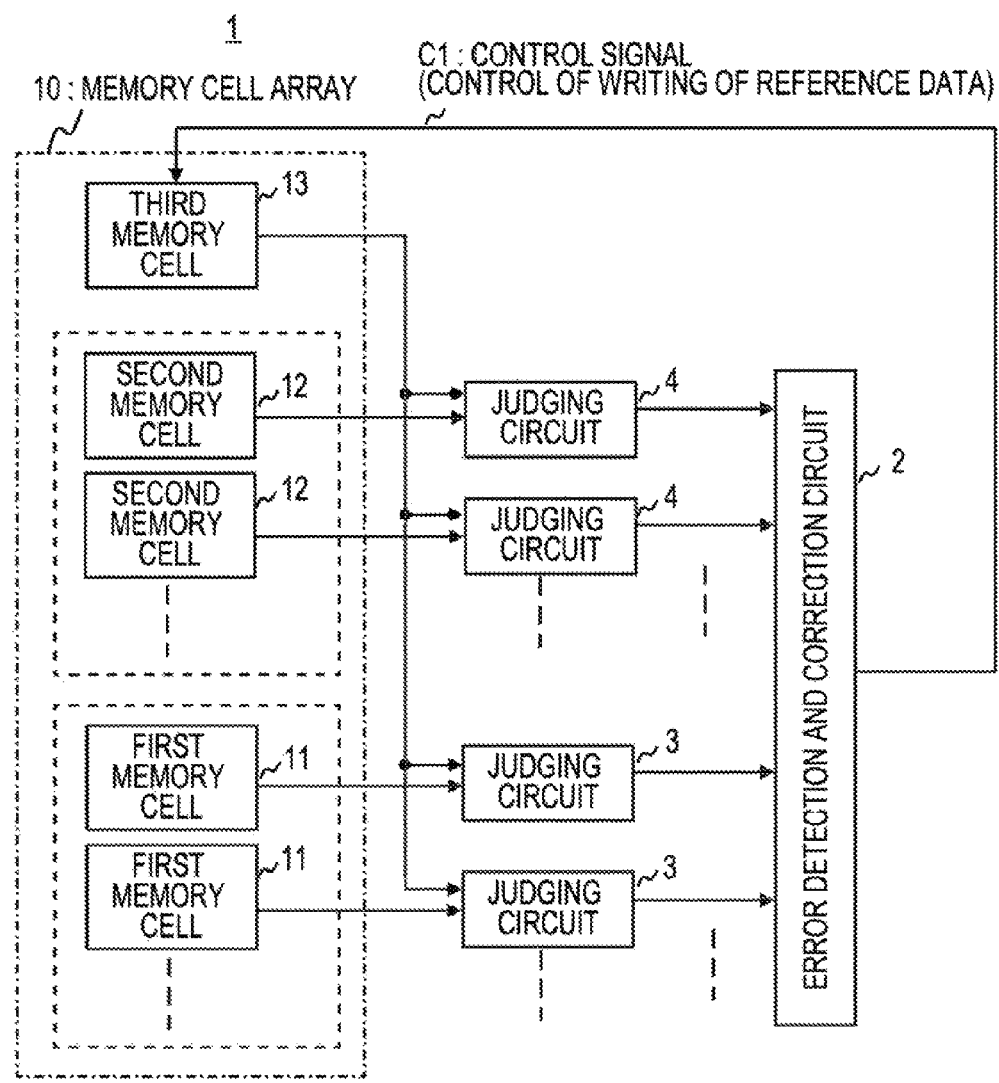
FIG. 1 is a block diagram showing a configuration of a semiconductor device according to an exemplary embodiment.

First, a description is given as an outline of an exemplary embodiment of the present invention. It is to be noted that reference symbols in the drawings attached to the outline description of exemplary embodiments are examples provided solely to aid understanding what the exemplary embodiments mean, and are not intended to limit the invention to modes shown in the drawings.

A semiconductor device 1 according to an exemplary embodiment, as shown in FIG. 1, is provided with: a memory cell array 10 including a plurality of first memory cells 11, a plurality of second memory cells 12, and one or more third memory cells 13; judging circuits 3 and 4 that judge a plurality of data values held by a selected plurality of first memory cells 11 and a selected plurality of second memory cells 12 by referring to a reference signal (corresponding to VREF in FIG. 2 and FIG. 4) corresponding to reference data held by a selected third memory cell 13; and an error detection and correction circuit 2 that detects whether or not there is an error in outputs of the judging circuit 3 and/or the judging circuit 4 by calculating data of the outputs of the judging circuit 3 and the judging circuit 4 as error correcting codes. Here, when the error detection and correction circuit 2 detects errors exceeding error correction capability, a rewrite operation is performed to the third memory cell 13 selected simultaneously with the first and second memory cells.

According to the abovementioned configuration, when the third memory cell has an error, the error detection and correction circuit 2 detect a plurality of errors, of which a number exceeds the error correction capability of the error detection and correction circuit, in first and second memory cells. That is, this configuration enables to avoid generating a plurality of errors by rewriting reference data to the third memory cell. As a result, a subsequent reading operation can be executed without errors.

Figure 5:
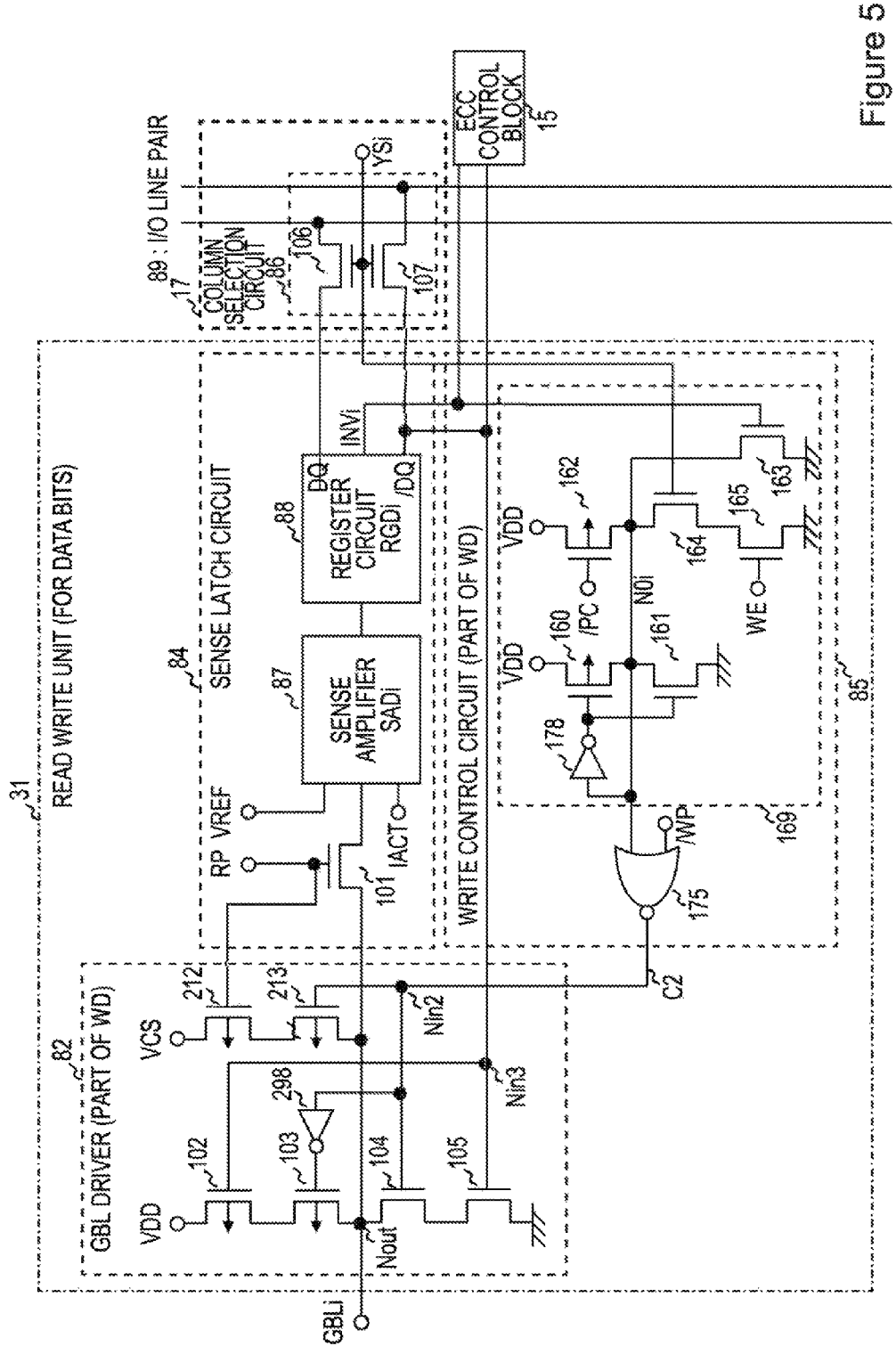
FIG. 5 is a circuit diagram of a read write unit (for data bits) of the semiconductor device according to the first exemplary embodiment.

In the abovementioned semiconductor device, the abovementioned error detection and correction circuit 2 may be provided with a syndrome generation unit that generates a syndrome from a plurality of data of the outputs of the judging circuits 3 and 4 in FIG. 1; a syndrome decoder using the syndrome to identify whether or not the first and second memory cells have an error and which one of the first and second memory cells has an error when the error exists; and an error correction unit that outputs an inverted control signal (INVi in FIG. 5; INVj in FIG. 6 and FIG. 9) to invert the data of a specified one of the first and second memory cells so that the error data of the specified one of the first and second memory cells is corrected and the corrected data is outputted. Here, if the error remains after performing this error correction based on the inverted control signal outputted by the error correction unit, the error detection and correction circuit 2 may determine that an error exceeding the error correction capability exists.

Figure 4:
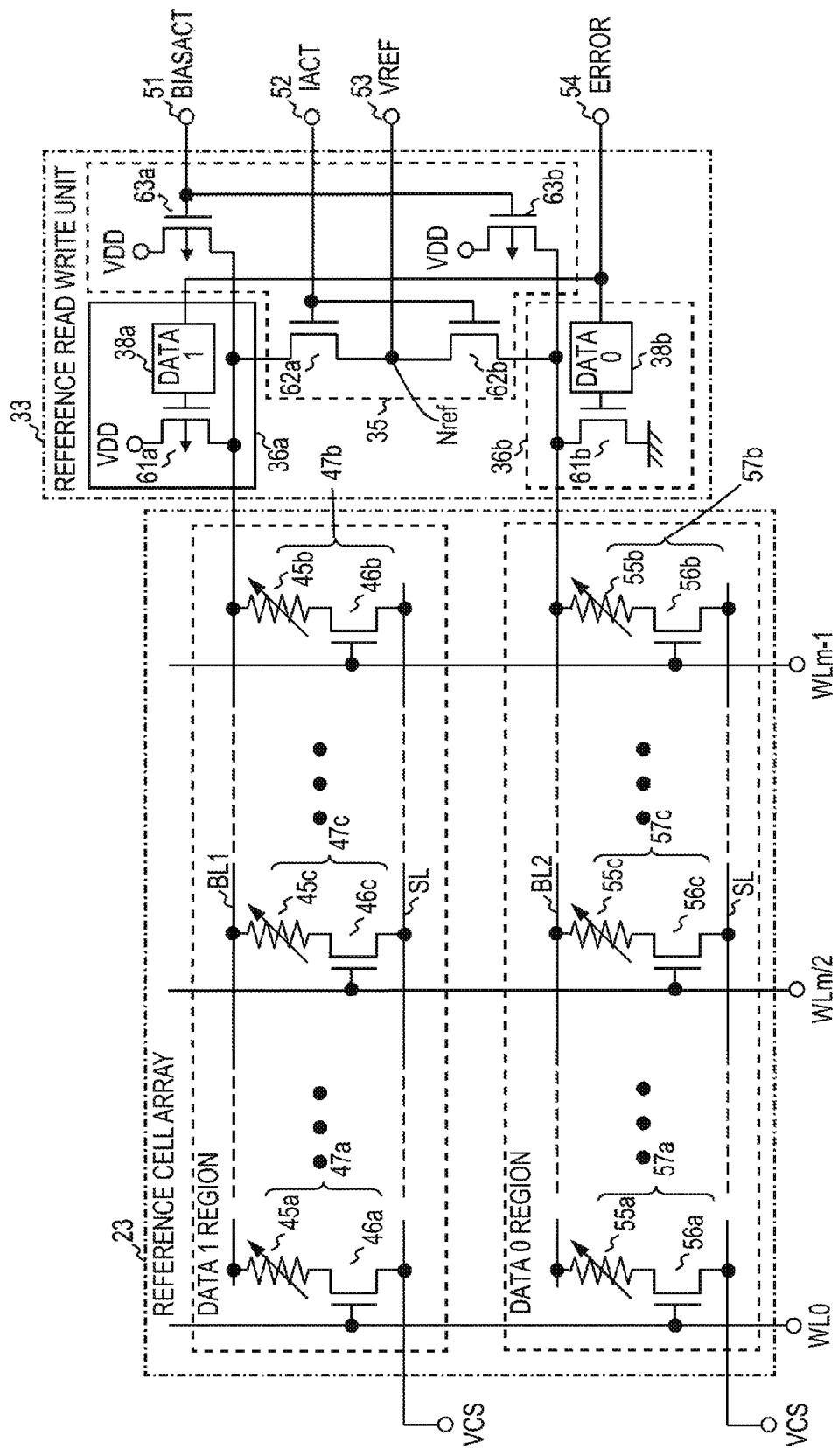
FIG. 4 is a circuit diagram of a reference cell array and a reference read write unit of the semiconductor device according to the first exemplary embodiment.

The abovementioned semiconductor device, as shown in FIG. 4, is preferably further provided with a reference read write unit 33 that includes a reference read circuit 35 that reads reference data held in selected ones of the third memory cells (one is selected among 47a to 47c, and the other is selected among 57a to 57c in FIG. 4; When a word line WL0 is active, for example, 47a and 57a are selected), and outputs a reference signal (for example, reference voltage VREF) corresponding to reference data; and reference write circuits (36a and 36b) that write a first logic value to a selected one of the third memory cells 47a to 47c and a second logic value different from the first logic value to a selected one of the third memory cells 57a to 57c.

In the abovementioned semiconductor device, as shown in FIG. 4, the third memory cell may include a memory cell (memory cells 47a to 47c in a data 1 region in FIG. 4) that holds data of a first logic value, and a memory cell (memory cells 57a to 57c in a data 0 region in FIG. 4) that holds data of a second logic value. The reference read circuit 35 may be configured to supply a reference voltage VREF to a node Nref. For example, when the word line WL0 is activated, both the third memory cells 47a and 57a are selected to generate first and second reference voltages at BL1 and BL2, respectively. The first and second reference voltages are mixed at the node Nref through transistors 62a and 62b to generate the reference voltage VREF. The reference voltage VREF is substantially equal to an intermediate voltage between the first and second reference voltages. The reference write circuits (36a and 36b) may write data of each of the first and second logic values (for example, data of the first logic value is data "1" and data of the second logic value is data "0") to the third memory cells (for example, 47a and 57a when the word line WL0 is active).

The reference read write unit 33, as shown in FIG. 4, may be provided with a first reference bit line BL1 connected to the third memory cells (47a to 47c) that hold data of the first logic value, a second reference bit line BL2 connected to the third memory cells (57a to 57c) that hold data of the second logic value, and first and second transistors (62a and 62b) connected in series between the first reference bit line BL1 and the second reference bit line BL2, and may generate a reference voltage VREF) at a connection node Nref.

Figure 3:
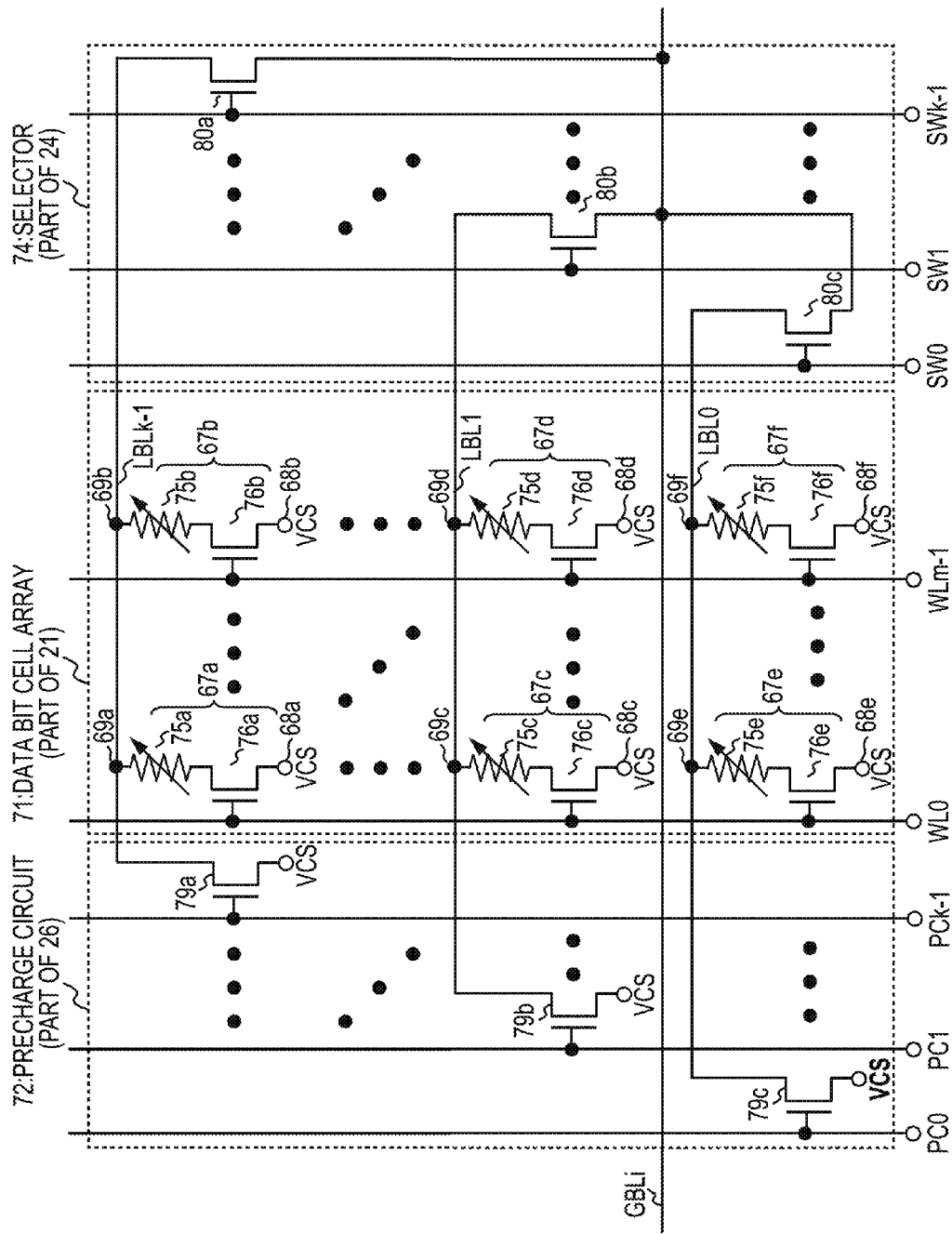
FIG. 3 is a circuit diagram of a data bit cell array and surroundings thereof, of the semiconductor device according to the first exemplary embodiment.

The abovementioned semiconductor device may be provided with word lines (WL0 to WLm−1) connected in common to first control electrodes (first control electrodes of the first memory cells are gates of cell transistors 76a to 76f in FIG. 3; second control electrodes of the second memory cells are not shown in the drawings) of the plural first and second memory cells and third control electrodes (third control electrodes of the third memory cells are gates of cell transistors 46a to 46c, 56a to 56c in FIG. 4).

Figure 2:
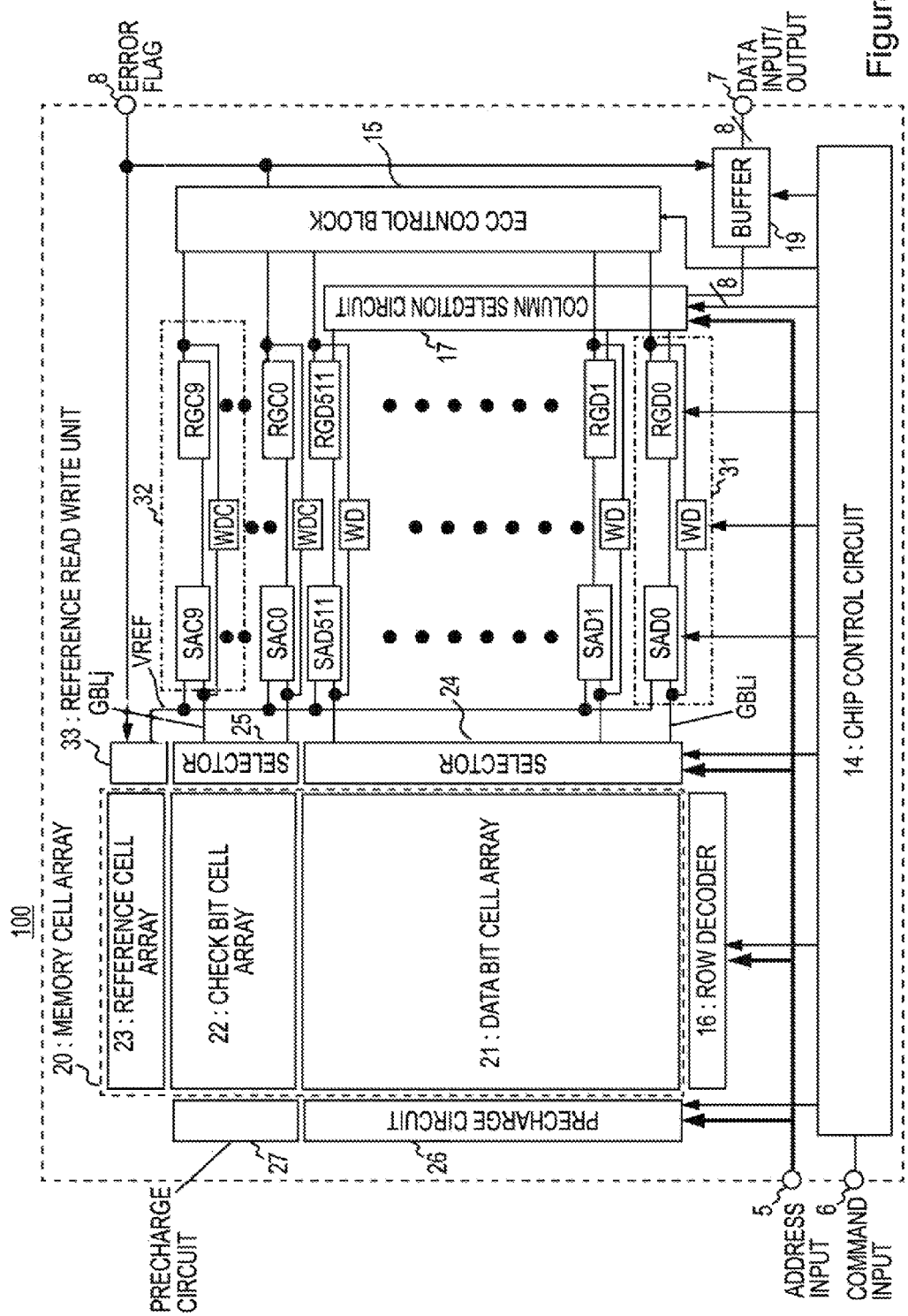
FIG. 2 is a block diagram showing a configuration of the semiconductor device according to a first exemplary embodiment.

In the abovementioned semiconductor device, data held by the plural first memory cells (11 in FIG. 1, memory cells included in a data bit cell array 21 in FIG. 2) may be data bits for external input/output, and data held by the plural second memory cells (12 in FIG. 1, memory cells included in a check bit cell array 22 in FIG. 2) may be check bits used inside the semiconductor device for the error correction The check bits are internally generated in the ECC CONTROL BLOCK 15 in FIG. 2 and not outputted outside the semiconductor device.

The abovementioned semiconductor device, as shown in FIG. 2, is preferably further provided with an output buffer (corresponding to a buffer 19 in FIG. 2) that is configured to output a plurality of data held by the first memory cells when the error exceeding the error correction capability is not detected and to output an error signal (error flag in FIG. 2) without outputting any data held by the first memory cells when the error exceeding the error correction capability is detected.

A detailed description is given below concerning respective exemplary embodiments of the present invention, making reference to the drawings.

FIRST EXEMPLARY EMBODIMENT (Configuration of the First Exemplary Embodiment)

A detailed description is given with reference to FIG. 2 to FIG. 6. FIG. 2 is a block diagram showing a configuration of a semiconductor device 100 according to the first exemplary embodiment. In FIG. 2, the semiconductor device 100 has a memory cell array 20 that includes a plurality of memory cells, and is provided with data input output terminals 7 each of which receives read data or write data, command input terminals 6 each of which receives a corresponding one of command signals to control the semiconductor device 100, and address input terminals 5 each of which receives a corresponding one of address signals to select one or ones of memory cells.

The memory cell array 20, as shown in FIG. 2 comprises a data bit cell array 21, a check bit cell array 22, and a reference cell array 23. Below, the memory cells in the data bit cell array 21, the check bit cell array 22 and the reference cell array 23 are respectively referred to as data bit cells, check bit cells and reference cells (respectively corresponding to 11, 12 and 13 in FIG. 1). Data of the data bit cell and the check bit cell, which has been sense-amplified by a sense amplifier, are referred to respectively as a data bit and a check bit. A row decoder 16 is arranged adjacent to the memory cell array 20, and the row decoder 16 decodes a row address included in an address signal received from the address input terminals 5, and selects and activates one of the word lines (WL0 to WLm−1 in FIG. 3).

A selector 24 and a selector 25 are arranged adjacently to the data bit cell array 21 and the check bit cell array 22, respectively. In each of the data bit cell array 21 and the check bit cell array 22, a hierarchical structure that includes a plurality of local bit lines LBLs coupled to a global bit line GBL is provided. The connection signals (SW0 to SWk−1 in FIG. 3) select one of the local bit lines to be connected to the global bit line GBL.

As described above, a memory cell selected by a corresponding-activated word line is connected to a corresponding local bit line, and then the corresponding local bit line is connected to a global bit line when the corresponding local bit line is selected by a corresponding-activated connection signal. Here, there are 512 global bit lines GBL for the data bit cell array 21, and these global bit lines are denoted as GBLi below (i=0 to 511). There are 10 global bit lines GBL for the check bit cell array 22, and these global bit lines are denoted as GBLj below (j=0 to 9).

Read write units (for data bits) 31 are connected to the global bit lines GBLi, respectively. Read write units (for check bits) 32 are connected to the global bit lines GBLj, respectively. The read write units (for data bits) 31 includes a sense amplifier SADi, a register circuit RGDi, and a write driver WD. The read write units (for check bits) 32 includes a sense amplifier SACj, a register circuit RGCj, and a write driver WDC.

In the read write units (for data bits) 31 a global bit line GBLi is connected to an input terminal of a sense amplifier SADi. Similarly, in the read write units (for check bits) 32 a global bit line GBLj is connected to an input terminal of a sense amplifier SACj.

Adjacent to the data bit cell array 21, a precharge circuit 26 that precharges the global bit line GBLi and each of the local bit lines LBL to a prescribed potential is arranged. Similarly, adjacent to the check bit cell array 22, a precharge circuit 27 that precharges a global bit line GBLj and each of the local bit lines LBL to a prescribed potential is arranged.

Adjacent to the reference cell array 23, a reference read write unit 33 that performs reading/writing on reference cells is arranged. A signal of a reference cell read by the reference read write unit 33 is supplied to another input terminal of the sense amplifiers SADi and SACj.

Each of the sense amplifiers SADi and SACj amplifying a potential difference between a potential of the global bit line and the reference potential VREF The amplified potential is stored in the respective register circuits RGDi and RGCj as a judgment result. The sense amplifiers SADi and SACj respectively correspond to a judging circuit 3 and a judging circuit 4, in FIG. 1.

In FIG. 2, the semiconductor device 100 is further provided with a chip control circuit 14, an ECC control block 15, a column selection circuit 17, and a buffer 19. The chip control circuit 14 receives a command signal inputted from a command input terminal 6, and in response to the command signal, controls operation of the row decoder 16, the selectors 24 and 25, the prechargers 26 and 27, the sense amplifiers (SADi and SACj), the ECC control block 15, the column selection circuit 17, and the buffer 19.

The ECC control block 15 has a function to execute error detection and correction using ECC. In a write operation the ECC control block generates the 10 check bits in accordance with 512 data bits input from outside the semiconductor device and in a read operation the ECC control block detects whether or not the 512 data bits and 10 check bits contains an error by performing an ECC calculation on the 512 data bits and the 10 check bits. The ECC control block 15 of the present exemplary embodiment employs an ECC method that uses hamming code having 1 bit error correction capability. It is to be noted that there is no limitation to this method, and another error detection method and correction method may be applied.

Next, FIG. 3 is a circuit diagram including a data bit cell array 71 including memory cells of which one is connected to a global bit line GBLi, a precharge circuit 72 (part of the precharge circuit 26 in FIG. 2) and a selector 74 (part of the selector 24 in FIG. 2). The data bit cell array 71 includes m×k memory cells (67a to 67f) arranged at intersections of m word lines WL0 to WLm−1 and k local bit lines LBL0 to LBLk−1. Each of the memory cells (67a to 67f) includes a resistance variable element (75a to 75f) and a cell transistor (76a to 76f) coupled to each other. The word lines WL0 to WLm−1 are connected to gates of the cell transistors, respectively. One of source and drain of each cell transistor is connected to a source plate to which a power supply VCS is supplied.

The resistance variable elements (75a to 75f), for example, are magnetic tunnel junction (MTJ) elements used in STT-RAM that performs spin injection magnetization reversal writing. A magnetic tunnel junction (MTJ) element is configured by interposing a tunnel barrier layer with ferromagnetic layers, and, for example, MgO is used as the tunnel barrier layer, and CoFe or an alloy including CoFe is used as the ferromagnetic layers. The resistance variable elements (75a to 75f) are of bipolar type. Specifically, when data "1" and data "0" are written, voltages V1 and V0 applied to the respective local bit lines LBL are arranged such that V1=VDD, V0=VSS, and V0<VCS<V1.

The precharge circuit 72 is configured by k precharge NMOS transistors including 79a to 79c, the k precharge NMOS transistors precharge k local bit lines LBL, respectively. Here, k precharge signals PC0 to PCk−1 are respectively connected to gates of the precharge NMOS transistors. When the respective precharge signals PC0 to PCk−1 are controlled to have a High level, each of the local bit lines LBL0 to LBLk−1 is electrically connected to a power supply VCS to be precharged to a potential VCS.

The selector 74 is configured by k connection NMOS transistors including 80a to 80c, corresponding to k local bit lines LBL. Here, k connection signals SW0 to SWk−1 are respectively connected to gates of the connection NMOS transistor. Each of the local bit lines LBL is selected in response to a corresponding one of the connection signals which takes a High level, and the selected local bit line LBL is electrically connected to the global bit line GBLi. On the other hand, since (k−1) unselected local bit lines LBL are held at a potential VCS according to activation of a precharge signal, even for a memory cell connected to the selected word line doesn't have a current.

Furthermore, each of the control signals PC0 to PCk−1, the word lines WL0 to WLm−1 and the connection signals SW0 to SWk−1 of the precharge circuit 72, the data bit cell array 71 and the selector 74 described above has a High level at a potential VPP (VPP>VDD) and a Low level at a potential VSS.

A terminal 69e related to one memory cell (for example, 67e) connected to a selected word line WL and a selected local bit line LBL, at a time of writing, is electrically connected to a corresponding write driver WD via the local bit line LBL0 and the global bit line GBLi. At a time of reading, the terminal 69e is electrically connected to a corresponding sense amplifier SADi via the local bit line LBL0 and the global bit line GBLi.

Furthermore, in the check bit cell array 22, a configuration of a portion connected to one global bit line GBLj and surroundings thereof (a part of the precharge circuit 27 and a part of the selector 25 is similar to FIG. 3.

Next, referring to FIG. 4, a description is given about the reference cell array 23 and the reference read write unit 33. As shown in FIG. 4, the reference cell array 23 is configured by a data 1 region and a data 0 region. Here, reference data corresponding to data "1" is stored in a reference cell in the data 1 region, and reference data corresponding to data "0" is stored in a reference cell in the data 0 region. Here, data "1" and data "0" correspond to two resistance states, respectively.

The data 1 region and the data 0 region respectively include m memory cells (47a to 47c and 57a to 57c), and each of gates of cell transistors (46a to 46c, and 56a to 56c) of the respective memory cells are connected to a corresponding one of the word lines (WL0 to WLm−1). The memory cells (47a to 47c and 57a to 57c) of the reference cell array 23, adopt STT-RAM resistance variable elements (magnetic tunnel junction elements) such as the data bit cells and the check bit cells.

Ones of Sources and drains of the respective cell transistors (46a to 46c, and 56a to 56c) are connected to a source plate to which a power supply VCS is supplied. One end of the respective resistance variable elements 45a to 45c, with regard to the data 1 region, is connected to a reference bit line BL1, and one end of the respective resistance variable elements 55a to 55c, with regard to the data 0 region, is connected to a reference bit line BL2.

Similarly to a case of the data bit cells and check bit cells, gates of cell transistors of the reference cell area are connected to corresponding word lines (WL0 to WLm−1), and a pair of reference cells are selected according to a word line. In this way, reference cells corresponding to a selected word line are selected one by one from the data 1 regions and the data 0 regions. For example, when the word line WL0 is selected, the reference cells 47a and 57a are selected.

Next, a description is given about the reference read write unit 33. The reference read write unit 33 includes a reference read circuit 35 that reads selected reference cells and outputs a reference signal, and reference write circuits (36a and 36b) that write reference data to a selected reference cell.

The reference read circuit 35 include PMOS transistors (63a and 63b), and NMOS transistors (62a and 62b). The reference read circuit 35 receives a control signal IACT activated in response to an active command, via an IACT terminal 52. The reference read circuit 35 receives a signal BIASACT supplying a bias level to the PMOS transistors (63a and 63b), via a BIASACT terminal 51. The signal BIASACT is supplied to a gate of the PMOS transistors (63a and 63b), and the PMOS transistors (63a and 63b) function as a constant current source. Ones of sources and drains of the PMOS transistors (63a and 63b) are respectively connected to reference bit lines BL1 and BL2. The constant current supplied by the PMOS transistors (63a and 63b) flows to the selected reference cells (for example, when WL0 is selected, 47a and 57a become the selected reference cells), via the reference bit lines BL1 and BL2. A level of the signal BIASACT is set not to overwrite a difference value to the reference cell.

The NMOS transistors 62a and 62b are connected in series between the reference bit line BL1 and the reference bit line BL2 to generate an intermediate voltage VREF as a reference potential at a connection node Nref when a control signal IACT takes a High level.

Next, on receiving an error signal generated by the ECC control block 15 via an ERROR terminal 54, the reference write circuits 36a and 36b perform a rewrite operation on a selected reference cell. Here, an error signal is activated (goes to a High level) when an error exceeding error correction capability occurs. The reference write circuit 36a includes a PMOS transistor 61a and a bias voltage output circuit (data 1) 38a. In the same way, the reference write circuit 36b includes an NMOS transistor 61b and a bias voltage output circuit (data 0) 38b. The bias voltage output circuit (data 1) 38a receives the error signal of the ERROR terminal 54, and supplies a bias voltage necessary for writing data "1", to a gate of the PMOS transistor 61a. In the same way, the bias voltage output circuit (data 0) 38b receives the error signal of the ERROR terminal 54, and supplies a bias voltage necessary for writing data "0" to a gate of the NMOS transistor 61b.

Since each the resistance variable elements is of a bipolar type, when a resistance variable element goes to a low resistance state by data "1" being written, the voltage of the reference bit line BL is set higher than the power supply VCS, and when the resistance variable element goes to a high resistance state by data "0" being written, the voltage of the reference bit line BL2 is set lower than the power supply VCS.

In the present exemplary embodiment, a plurality of reference cells are arranged corresponding to a plurality of word lines (WL0 to WLm−1), and the reference cell is selected according to a word line similarly to the data bit cell and the check bit cell. Such an arrangement is advantageous in reducing a difference between a bit line length from each of the data bit cell and the check bit cell to a sense amplifier (the bit line length includes lengths of the global bit line GBLi and the local bit line LBL) and a line length of each of the reference bit lines BL1 and BL2, as a result a resistance difference can be reduced to ensure a read margin. However, the reference cell array is not limited to the abovementioned configuration and other configurations are available. For example, rather than providing a pair of the reference cells for each word line, word lines may be divided into several groups and the pair of the reference cells may be provided for each group. Or, sharing the pair of the reference cells among the word lines or the groups is available.

In the present exemplary embodiment, reference cells corresponding to data 1 and data 0 are provided, but instead a configuration is possible in which reference cells, having an intermediate resistance value between resistance values corresponding to data 1 and data 0, are used, to output a reference potential VREF.

Next, a description is given about the read write unit (for data bits) 31 with reference to FIG. 5. FIG. 5 is a circuit diagram of the read write unit (for data bits) 31. In FIG. 2, the read write unit (for data bits) 31 includes the sense amplifier SADi, the register circuit RGDi, and the write driver WD, provided for one global bit line GBLi. In FIG. 5, the write driver WD includes a write control circuit 85 and a GBL driver 82 in detail, and details of the respective circuits are shown. In FIG. 5, sense latch circuit 84 has a portion including the sense amplifier SADi and the data register circuit RGDi.

Firstly, a description is given about the write control circuit 85. The write control circuit 85 receives a column selection signal and includes an inverted control signal detection circuit 169 and a NOR logic circuit 175.

The column selection signal/inverted control signal detection circuit 169 makes a selection among the data registers RGDi (i=0 to 511), between where there is writing via the column selection circuit 17, and where an error correction has been made by the ECC control block 15. The column selection signal/inverted control signal detection circuit 169 performs control to write to a data bit cell, limited to a data register circuit RGDi corresponding to any thereof.

The column selection signal/inverted control signal detection circuit 169 has a rewrite node N0i and a PMOS transistor 162 connected to the rewrite node N0i. When a precharge signal/PC is activated at a Low level in a prescribed precharge period, the rewrite node N0i is precharged to a potential VDD in advance, via the PMOS transistor 162. That is, the PMOS transistor 162 functions as a precharge circuit. The column selection signal/inverted control signal detection circuit 169 has NMOS transistors 164 and 165 connected in series between the rewrite node N0i and ground, and an NMOS transistor 163 connected between the rewrite node N0i and ground. An inverted control signal INVi, a column selection signal YSi, and a write enable signal WE are respectively supplied to gates of NMOS transistors (163, 164, and 165).

According to the configuration described above, the rewrite node N0i precharged in advance to potential VDD is controlled to transition to a Low level when the write enable signal WE takes a High level (WE goes to a High level when a write command Wt is executed to perform data writing to a data register circuit RGDi via the column selection circuit 17) and a column selection signal YSi takes a High level (at a time of selection). When an inverted control signal INVi is outputted from the ECC control block 15, the transition to a Low level is also performed.

A PMOS transistor 160 and an NMOS transistor 161 are connected in series between a power supply VDD and ground to configure one inverter circuit. This one inverter circuit is connected to an inverter circuit 178. A latch circuit is configured in this way. The PMOS transistor 160, the NMOS transistor 161 and an input terminal of the inverter circuit 178 are connected to the rewrite node N0i. According to the configuration described above, the potential of the node N0i that is controlled by/PC, YSi, WE and INVi, is held by the latch circuit.

One input terminal of the NOR logic circuit 175 is connected to the rewrite node N0i, and the other input terminal is supplied with a write pulse signal/WP. In this way, when the write pulse signal/WP has a Low level and the rewrite node N0i has a Low level, the control signal C2 (output of the NOR logic circuit 175) is activated to a High level.

Next, a GBL driver 82 is configured to receive the control signal C2 described above to drive the respective global bit lines GBLi. The GBL driver 82 includes PMOS transistors (102 and 103), NMOS transistors (104 and 105) and an inverter circuit 298. The PMOS transistors (102 and 103) are connected in series between the power supply VDD and a node Nout, and the NMOS transistors (104 and 105) are connected in series between the node Nout and ground.

A gate of the NMOS transistor 104 is connected to a node Nin2, and a gate of the PMOS transistor 103 is connected to the node Nin2 via an inverter circuit 298.

In the GBL driver 82, two PMOS transistors 212 and 213 are connected in series between the power supply VCS and the global bit line GBLi. Here, a read pulse signal RP is supplied to a gate of the PMOS transistor 212, and a gate of the PMOS transistor 213 is connected to the node Nin2. The node Nin2 is connected to an output end of the NOR logic circuit 175 of the write control circuit 85, and a control signal C2 is supplied.

According to the configuration described above, when RP has a High level, the global bit line GBLi is disconnected from the power supply VCS. In a case where RP has a Low level and the control signal C2 has a Low level, the global bit line GBLi is connected to the power supply VCS through the PMOS transistors 212 and 213 to set a voltage level of the global bit line GBLi to the potential VCS. On the other hand, when RP has a Low level and the control signal C2 has a High level, the global bit line GBLi is driven based on/DQ of the register circuit RGDi (88). In this way, when/DQ has a High level (data 0), the global bit line GBLi is driven to a Low level (VSS), and when/DQ has a Low level (data 1), the global bit line GBLi is driven to a High level (VDD).

Next, a description is given about the sense latch circuit 84. The sense latch circuit 84, as shown in FIG. 5, includes a sense amplifier SADi (87), a register circuit RGDi (88), and an NMOS transistor 101. A read pulse signal RP is supplied to a gate of the NMOS transistor 101, and one of source or drain of the NMOS transistor 101 is connected to the global bit line GBLi. The other of the source or drain of the NMOS transistor 101 is connected to an input end of the sense amplifier SADi (87). A control signal IACT is supplied to the sense amplifier SADi.

According to the configuration described above, in the sense latch circuit 84, when the read pulse signal RP is controlled to a High level and the control signal IACT is activated, the NMOS transistor 101 is conductive and an input end of the sense amplifier SADi (87) and the global bit line GBLi are electrically connected. At this time, the sense amplifier SADi performs an operation of sense amplification as previously described.

In the column selection circuit 17, an input output circuit 86 is connected between DQ and/DQ terminals of the register circuit RGDi of the 512 read write units (for data bits) 31, and I/O line pairs 89, respectively.

The input output circuit 86 includes two NMOS transistors 106 and 107. A gate of the NMOS transistor 106 and a gate of the NMOS transistor 107 are connected to each other at a connection node which receives a column selection signal YSi. As shown in FIG. 5, ones of sources and drains of the NMOS transistors 106 and 107 are connected respectively to output terminals DQ and/DQ of the register circuit RGDi, and the others of the sources and drains of the NMOS transistors 106 and 107 are respectively connected to the I/O line pair 89.

According to the configuration described above, at the time of an issuance of a read command Rd, data, which is stored in the register circuit RGDi and selected by the column selection signal YSi, is outputted to the buffer 19 via the I/O line pair 89, and data is outputted from the data input output terminal 7 via the buffer 19. On the other hand, at the time of an issuance of a write command Wt, data is inputted from the data input output terminal 7, and data is written to the register circuit RGDi which is selected by the column selection signal YSi via the buffer 19 and the I/O line pair 89.

Figure 6:
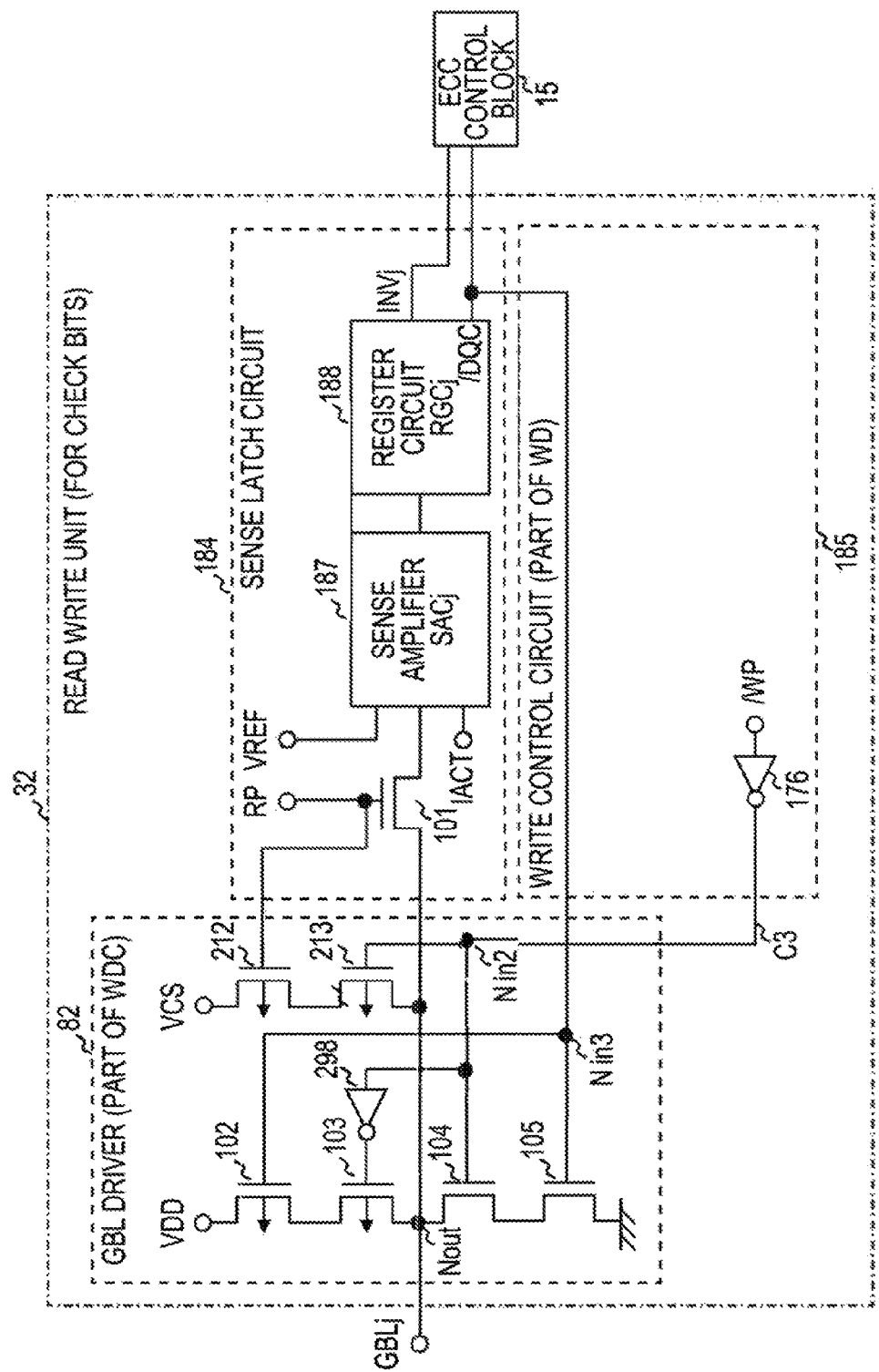
FIG. 6 is a circuit diagram of a read write unit (for check bits) of the semiconductor device according to the first exemplary embodiment.

Next, making reference to FIG. 6, a description is given about the read write unit (for check bits) 32. FIG. 6 is a circuit diagram of the read write unit (for check bits) 32. Since check bits are not inputted from or outputted to the outside, the read write unit (for check bits) 32 does not have a function for connecting to the I/O line pair 89. The write control circuit 185 is configured by the inverter circuit 76, and when a write pulse signal/WP is activated at a Low level, a control signal C3 (output of the inverter circuit 176) should be activated, and the GBL driver 82 is driven. The global bit line GBLj is then controlled by a signal of a/DQC terminal of the register circuit RGCj to write data of a check bit.

Next, a description is given about connections between the register circuits RGDi and RGCj and an ECC control block 15, in FIG. 5 and FIG. 6. A signal of the/DQ terminal of the register circuit RGCi and of the/DQC terminal of the register circuit RGCj are inputted to (received by) the ECC control block 15, and data bits and check bits are supplied to the ECC control block 15. On detecting an error, the ECC control block 15 identifies a location (position) of the error, and outputs inverted control signals INVi and INVj to the register circuits RGDi and RGCj corresponding to the location. The register circuits RGDi and RGCj that receive the inverted control signals INVi and INVj invert data thereof.

(Operation of the First Exemplary Embodiment)

Figure 7:
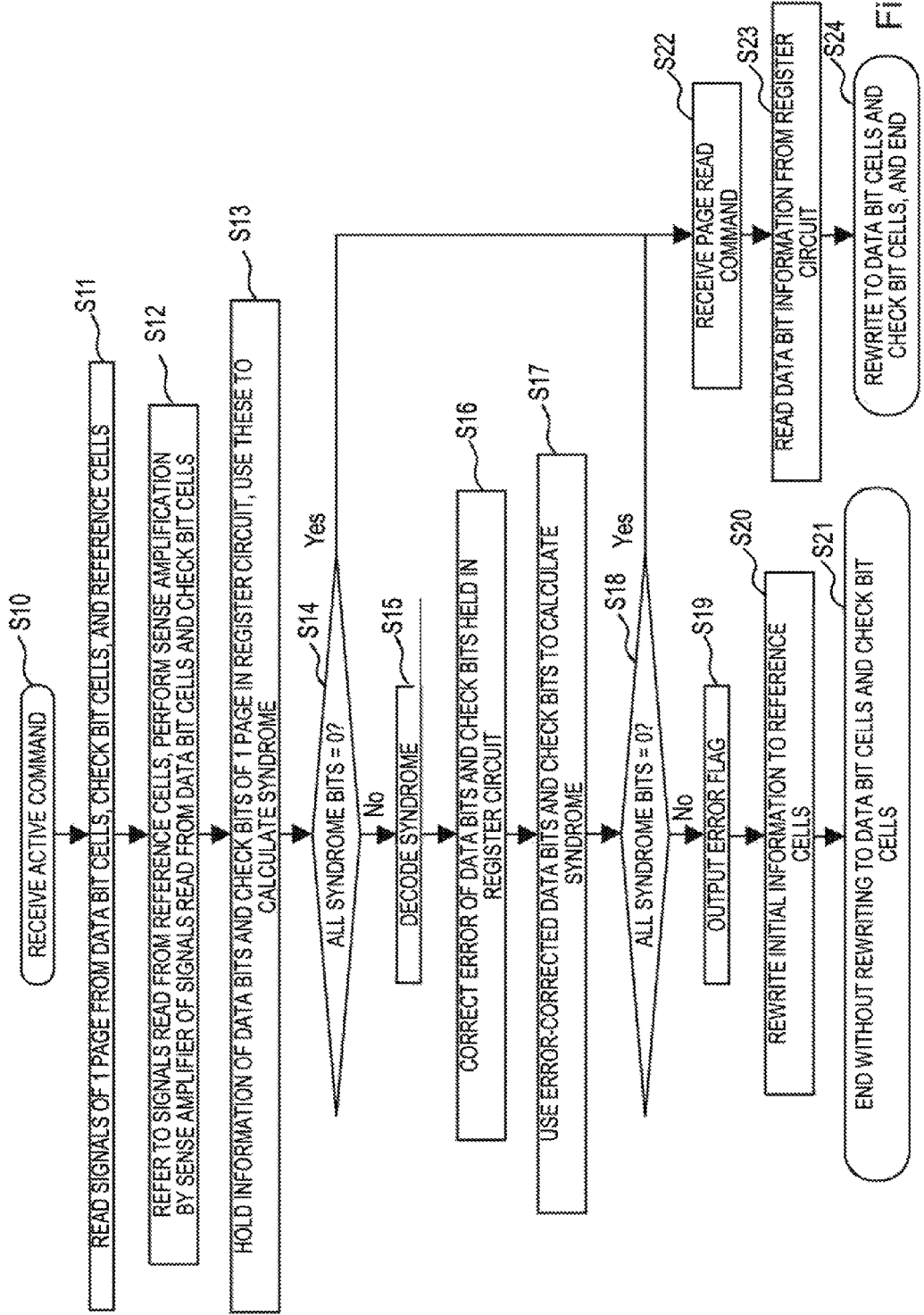
FIG. 7 is a flowchart showing operations of the semiconductor device according to the first exemplary embodiment.

Next, a description is given about operation of the first exemplary embodiment, making reference to FIG. 7. FIG. 7 is a flowchart showing operations of the semiconductor device according to the first exemplary embodiment. In FIG. 7, it is assumed that the semiconductor device 100 is provided with a page mode function. Data of 1 page includes data bits read by 512 read write units (for data bits) 31. A word line and a connection signal specify the 1 page. The 1 page includes data read at the same time from 512 memory cells connected to respective global bit lines GBLi. It is to be noted that the number of bits that configure 1 page is not limited to 512, and may be arbitrarily set. The number of check bits is set as appropriate in accordance with the number of data bits.

10 check bits written by the ECC control block 15 corresponding to 512 data bits are read at the same time. The data bits of 1 page (512 bits) and the 10 check bits, after being read, are respectively held in the register circuits RGDi and RGCj, and the ECC control block 15 executes error detection and correction in accordance with the 512 data bits and the 10 check bits.

In FIG. 7, firstly, when an active command is received (S10), data of the data bit cells, the check bit cells and the reference cells (S11) are respectively read. Here, 512 bits from the data bit cells, 10 bits from the check bit cells, and one reference potential VREF from a reference cell are obtained.

Next, referring to a reference voltage VREF, signals read from data bit cells and check bit cells are respectively sense-amplified by the sense amplifiers SADi and SACj (S12). Thereafter, information of data bits and check bits for 1 page is held in the register circuits RGDi and RGCj and a syndrome generation unit possessed by the ECC control block 15 calculates a syndrome (S13) with the information of the data bits and the check bits. The number of bits in the syndrome is 10, the same as the number of check bits. A judgment is then made as to whether or not all bits in the syndrome are 0 (S14).

All bits in the syndrome are 0 (Yes in S14) represents that there is no error in the read data bits and check bits, and control proceeds to S22. A page read command Rd is then received (S22), and data bits selected by the column selection circuit 17 from the register circuit RGDi are transferred to the data input output terminal 7 via the I/O line pair 89 and the buffer 19. Here, as shown in FIG. 2, at least 8 bits are simultaneously selected by the column selection signal YSi among the S12 data bits of 1 page, and are read from the data input output terminal 7. Here, the number of bits selected is not limited to 8, and, for example, all 512 bits may be selected. The selected data may be outputted in burst form.

Next, when a precharge command is issued to activate a write pulse signal/WP, a write operation is performed to memory cells corresponding to information of the register circuits RDGi and RDCj as necessary, and then the page is closed (S24). When an activated word line goes inactivated, the page corresponding to the activated word line is closed. However, in a case of Yes in S14, since an error correction by the ECC control block 15 is not performed (an inverted control signal INVi is not generated), and a write operation to the register circuit RDGi according to a write command does not occur (a rewrite node N0i stays at a High level), in S24, data bit rewriting is not performed, and only check bit rewriting is performed.

When one or more bits among all bits in a syndrome is 1, since the syndrome indicates that there is an error in some data bit or check bit, an error correction is performed for the data bits and check bits. Specifically, the syndrome is decoded by a syndrome decoder possessed by the ECC control block 15, and the location of data where an error has occurred is identified (S15). Inverted control signals (INVi and INVj) are outputted to the register circuits (RGDi and RGCj) corresponding to the identified location, and the error is corrected by inverting data held by the register circuits (S16).

Next using the data bits and check bits where the error has been corrected, the syndrome is again calculated by the syndrome generation unit of the ECC control block 15 (S17). A judgment is then made as to whether or not all bits in the recalculated syndrome are 0 (S18). When all bits in the syndrome are 0 (Yes in S18), control proceeds to S22, a page read command is received (S22), and data bits, which is stored in the register circuit RGDi, is selected by the column selection circuit 17 to be read to the data input output terminal 7 via the I/O line pair 89 and the buffer 19 (S23). When a precharge command is received to activate a write pulse signal/WP, a write operation is performed to memory cells corresponding to information of the register circuits RDGi and RDCj as necessary, and the page is closed (S24). In this S24, when an error correction by the ECC control block 15 has been performed on a data bit (an inverted control signal INVi is generated), the data bit is written to a memory cell corresponding to the register circuit RGDi for which an error correction has been performed. Rewriting of check bits is also performed.

When one or more bits among all bits of the recalculated syndrome are 1 (No in S18), which represents that the error exceeds the error correction capability, an error signal (S19) is outputted. Thereafter, on receiving an error signal from the ECC control block 15, the reference read write unit 33 performs rewriting of data 1 and data 0 to a selected data 1 region reference cell and a data 0 region reference cell (S20), respectively. And then, processing is ended without rewriting data to a data bit cell and a check bit cell (S21).

The above describes operations shown in the flowchart of FIG. 7. When there is an error in reference cell information, which generates a common reference potential VREF for reading 522 bits data (data bits and check bits), errors easily occurs in multiple bits. In this case, errors exceeding the error correction capability using ECC often occur. Accordingly, in the first exemplary embodiment, in a case of detecting errors exceeding the error correction capability using ECC, a control is performed to rewrite reference cell information. In this way, the reference cell information recovers, and it is possible to prevent an occurrence of such errors in subsequent read processing.

As described above, an effect indicated below is obtained according to the first exemplary embodiment. Firstly, as described above, when errors that exceed the error correction capability of ECC occur due to an error in reference cell information, there is an effect preventing the occurrence of such errors in subsequent read processing by rewriting the reference cell information.

When data bit information is written back to a memory cell, since writing back is limited to a case of data bits for which error correction was performed and data bits written to register circuits from outside, an effect is obtained in that the frequency of write back operations is low, and it is possible to curtail a power consumption in writing back.

Modified Example 1 of the First Exemplary Embodiment

Figure 8:
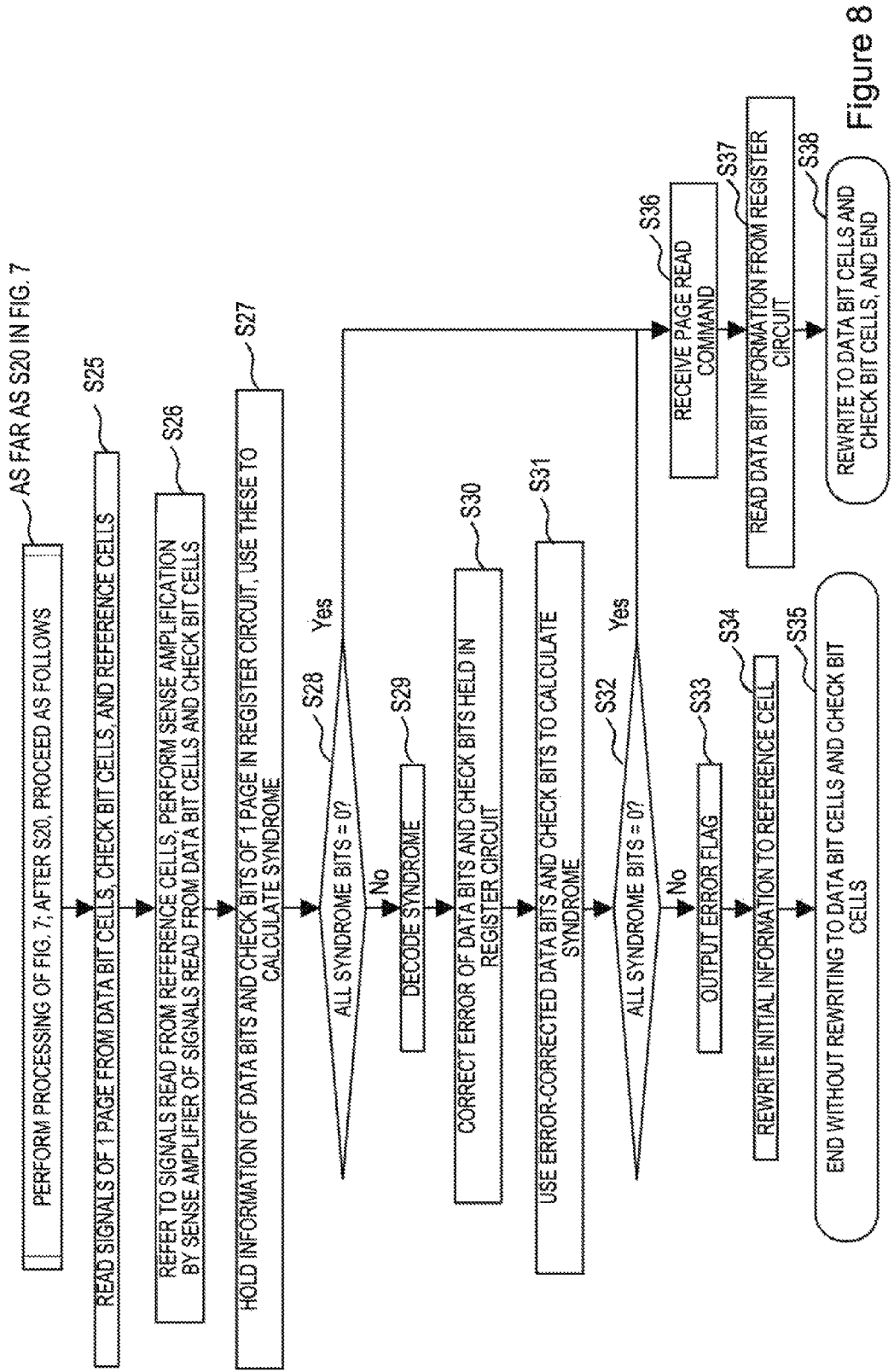
FIG. 8 is a flowchart showing operations of the semiconductor device according to modified example 1 of the first exemplary embodiment.

Next, a description is given concerning modified example 1 of the first exemplary embodiment, making reference to FIG. 8. FIG. 8 is a flowchart showing operations of the semiconductor device according to a modified example 1 of the first exemplary embodiment. In the modified example 1 of the first exemplary embodiment, operations of a step S25 and subsequent steps in FIG. 8 are added after step S20 in FIG. 7 of the first exemplary embodiment.

In FIG. 8, after executing processing of FIG. 7 and performing reference cell rewriting of S20 of FIG. 7, processing proceeds to S25 and subsequent steps of FIG. 8. Since the content of processing of S25 to S38 in FIG. 8 is the same as the content of processing of S11 to S24 of FIG. 7.

In FIG. 7, after reference cell rewriting (S20 in FIG. 7), there is a possibility of a judgment of Yes in S28. Even in a case of a judgment of No in S28, it's believed that errors in data bits and check bits can be corrected by S29 and S30 owing to a proper reference voltage VREF.

As described above, according to modified example 1 of the first exemplary embodiment, it is possible to consecutively and automatically re-execute a read operation for the data bits and the check bits with curtailing a delay in a read time and it is possible to simply implement an operation of reading correct information.

Modified Example 2 of the First Exemplary Embodiment

Figure 9:
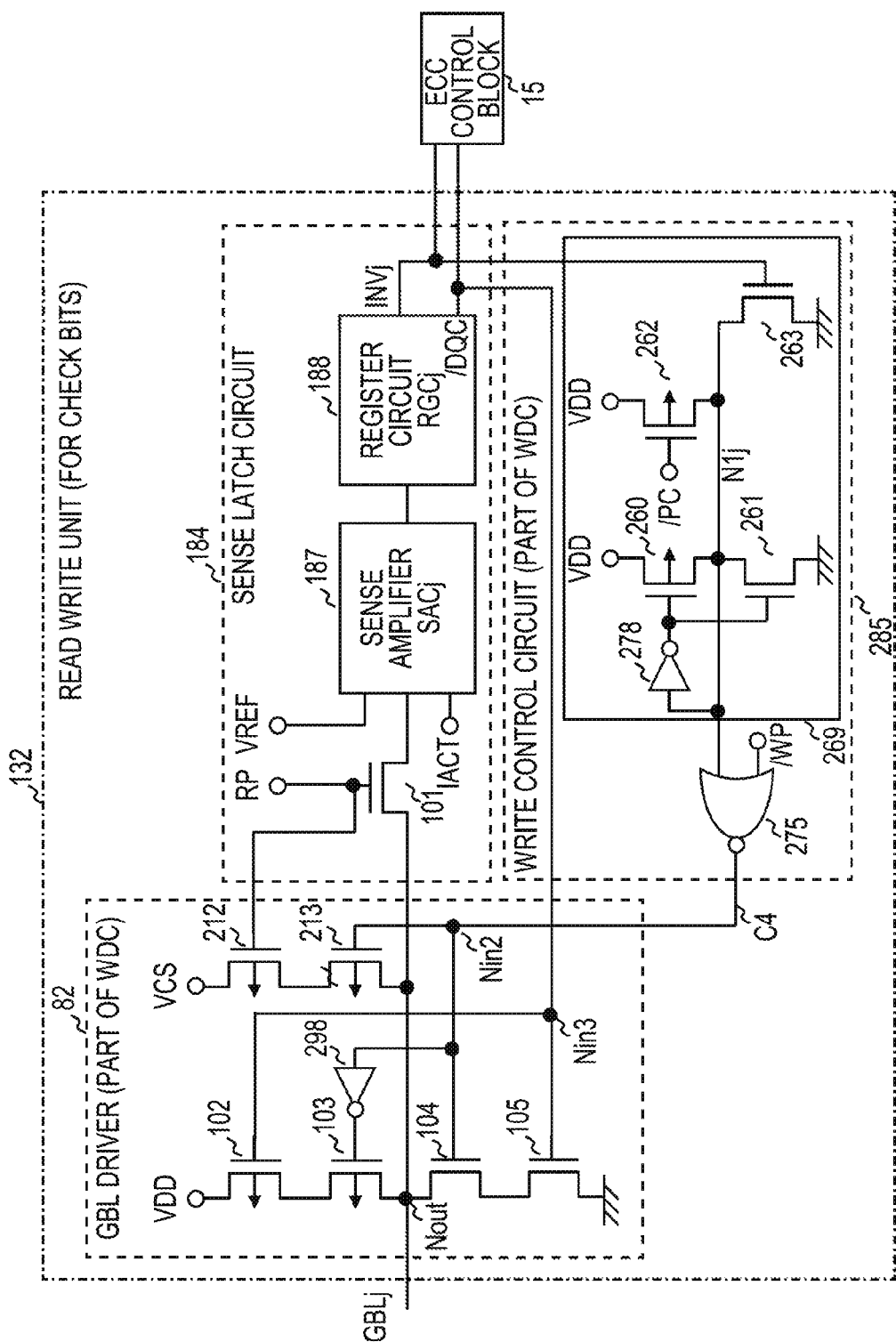
FIG. 9 is a circuit diagram of a read write unit (for check bits) of the semiconductor device according to modified example 2 of the first exemplary embodiment.

Next, a description is given concerning modified example 2 of the first exemplary embodiment, making reference to FIG. 9. FIG. 9 is a circuit diagram of the read write unit (for check bits) of the semiconductor device according to modified example 2 of the first exemplary embodiment. As is understood by comparing FIG. 9 to FIG. 6 (the first exemplary embodiment), in FIG. 9 a write control circuit 285 of a check bit write driver WDC is different from the write control circuit 85 in FIG. 6, and has an inverted control signal detection circuit 269.

The inverted control signal detection circuit 269 in FIG. 9 has a configuration in which a control is performed by the inverted control signal INVj. The inverted control signal detection circuit 269 in FIG. 9 precharges a rewrite node N1j to VDD in advance, and in a case of receiving the inverted control signal INVj, performs control so that the rewrite node N1j transitions to a Low level.

By using the read write unit (for check bits) 132 of the configuration described above, even in a case of writing back check bit information to a memory cell, it is possible to write back only in a case of a check bit for which an error correction has been performed. In this way, according to modified example 2 of the first exemplary embodiment, compared to the first exemplary embodiment, a further effect is obtained of enabling the frequency of occurrence of write back operations to be reduced, thus enabling the curtailing of power consumption when writing back.

Second Exemplary Embodiment

Figure 10:
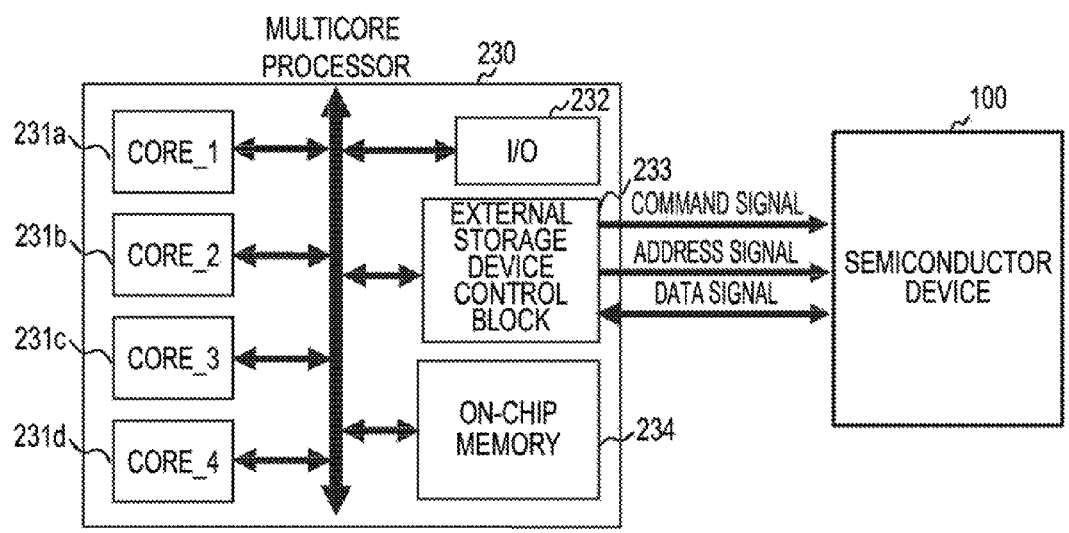
FIG. 10 is a block diagram showing a configuration of an information processing system according to a second exemplary embodiment.

FIG. 10 is a block diagram showing a configuration of an information processing system according to a second exemplary embodiment. The second exemplary embodiment illustrates an information processing system that includes a semiconductor device 100 according to the abovementioned exemplary embodiment (the first exemplary embodiment and modified examples 1 and 2 thereof) and a multi-core processor 230. The multi-core processor 302, as shown in FIG. 10, is configured to include core_1 to core_4 (231a to 231d), an I/O 232, an external storage device control block 233, and an on-chip memory 234. The external storage device control block 233 controls the semiconductor device 100 by exchanging a command signal, an address signal, and a data signal, with the semiconductor device 100.

Even in a case of using a resistance variable memory cell with a comparatively long write time, the semiconductor device 100 enables implementation of an effective page mode similar to DRAM. As a result, it is possible to ensure as much data band width as possible for a main memory bus, supporting the performance of the multi-core processor 230.

The semiconductor device 100 has an error correction function, and even in a case of error exceeding the correction capability due to an error in reference cell information, it is possible to reduce the probability of an error occurring in subsequent reading. In this way, according to the information processing system shown in FIG. 10, it is possible to provide an information processing system in which data reliability is improved, and even in a case of error exceeding the correction capability, it is possible to quickly recover to a normal state. Furthermore, with a configuration in which an error signal shown in FIG. 2 is received by the external storage device control block 233, the multi-core processor 230 may perform a recovery operation in response to the error signal, as appropriate.

It is to be noted that in the semiconductor device disclosed by the respective exemplary embodiments, a description has been given of a case of using STT-RAM that performs spin injection magnetization reversal writing using a magnetic tunnel junction (MTJ) element as a resistance variable element, but there is no limitation to this, and, for example, it is possible to apply the disclosed content of the respective exemplary embodiments also to a semiconductor device using Re-RAM (Resistive-Random Access Memory) that has a configuration in which a metal oxide, such as AlOx or HfOx, is interposed by electrodes including W or Ti or Ta, or using a Phase Change Memory (PCM).

In addition, in a semiconductor device that uses memory cells outside of resistance variable elements, it is possible to apply the disclosed content of the respective exemplary embodiments of the present disclosure to a case where reading is performed by a reference cell method.

It is to be noted that the ECC control block 15, which uses ECC disclosed in the respective exemplary embodiments, has a function to detect and correct error in both data bits and check bits, but there is no limitation thereto, and the function may detect and correct error in either one of data bits or check bits.

Part or all of each of the above exemplary embodiments can be described as the following modes. However, the above exemplary embodiments are not limited to the following modes.

(Mode 1)
An error correction method for a memory cell array including a plurality of first memory cells, a plurality of second memory cells, and one or more third memory cells that hold reference data, wherein the method comprises:
judging a plurality of data values held by selected first memory cells of the plurality of first memory cells and selected second memory cells of the plurality of second memory cells, by referring to a reference signal corresponding to reference data held by selected at least one of third memory cells;
detecting whether or not there is an error exceeding error correction capability in the judged data values of the plurality of first and/or second memory cells, with a judged data value of the plurality of first and second memory cells as an error correcting code; and
writing the reference data, in a case of detecting that there is an error exceeding error correction capability in the judged data values of the plurality of first and/or second memory cells, to the selected at least one of third memory cells.

(Mode 2)
The error correction method according to mode 1, wherein the detecting comprises:
a first error detecting whether or not there is an error in the judged data values of the plurality of first and/or second memory cells, with the judged data value of the plurality of first and second memory cells as an error correcting code;
an error correcting an error in a data value of the first and second memory cells detected in the first error detecting; and
a second error detecting again whether or not there is an error in a data value of the plurality of first and/or second memory cells after the error correcting; wherein
in a case where an error is detected in the second error detecting, a detection is made that there is an error exceeding error correction capability in a data value of the plurality of first and second memory cells.

(Mode 3)
The error correction method according to mode 2, wherein
the first and second error detecting generate a syndrome from the judged data values of the plurality of first and second memory cells, and detect that there is an error in a case where a bit other than 0 is present, among all bits of the syndrome, and
the error correcting identifies a location of data in which an error occurs among the judged data values of the plurality of first and second memory cells from the generated syndrome, and reverses data at the identified location.

(Mode 4)
The error correction method according to mode 1, wherein, in a case of detecting an error exceeding error correction capability in a data value of the plurality of first and second memory cells in the detecting, an operation of reading a data value of the first memory cells to the outside is not performed.

(Mode 5)
The error correction method according to mode 1, wherein, after performing the reference data writing, the judging and the detecting are performed again.

(Mode 6)
The error correction method according to mode 1, wherein
data held by the plurality of first memory cells includes data bits for external input/output, and
data held by the plurality of second memory cells includes check bits attached for error correction of the data bits.

It is to be noted that modifications and adjustments of the exemplary embodiments may be made within the bounds of the entire disclosure (including the scope of the claims) of the present invention, and also based on fundamental technological concepts thereof. Furthermore, various combinations and selections of various disclosed elements (including respective elements of the respective claims, respective elements of the respective exemplary embodiments, respective elements of the respective drawings, and the like) are possible within the scope of the claims of the present invention. That is, the present invention clearly includes every type of transformation and modification that a person skilled in the art can realize according to the entire disclosure including the scope of the claims and to technological concepts thereof. In particular, with regard to numerical ranges described in the present document, arbitrary numerical values or small ranges included in the relevant ranges should be interpreted to be specifically described even where there is no particular description thereof.

What is claimed is:
1. A semiconductor device comprising:
a plurality of memory cells;
a reference read write circuit coupled to at least one of the plurality of memory cells and configured to generate a reference voltage in response to data stored in the at least one of the plurality of memory cells;
a plurality of sense amplifiers each coupled to a respective memory cell of the plurality of memory cells, the respective memory cells different from the at least one of the plurality of memory cells, wherein the reference read write circuit and each of the sense amplifiers are configured to amplify data of each respective memory cell based on the reference voltage; and an error-correction code (ECC) control block coupled to the sense amplifiers and configured to output an error signal when the ECC control block detects that it is unable to correct error data in one or more respective memory cells;

wherein the reference read write circuit is configured to overwrite data in the at least one of the plurality of memory cells in response to the error signal.

2. The semiconductor device according to claim 1, wherein the reference read write circuit includes a reference node to which the reference voltage is supplied and the at least one of the plurality of memory cells includes a first and a second memory cell coupled to each other via the reference node.

3. The semiconductor device according to claim 2, wherein the first and the second memory cell are controlled to store different data from each other.

4. The semiconductor device according to claim 3, wherein the first and the second memory cell includes resistance variable elements, respectively, and the resistance variable elements of the first and the second memory cell are different in resistance value from each other.

5. The semiconductor device according to claim 1, wherein the ECC control block comprises:
a syndrome generation unit that generates a syndrome from the error data in the one or more respective memory cells;
a syndrome decoder that identifies a location of data where an error has occurred among the error data of the one or more respective memory cells from the generated syndrome; and
an error correction unit that outputs an inverted control signal to invert, with regard to the data at the location identified by the syndrome decoder, a value of the data;
wherein the syndrome generated by the syndrome generation unit indicates that error data is present, and the ECC control block detects that the error data exceeds error correction capability after performing error correction based on the inverted control signal output by the error correction unit.

6. The semiconductor device according to claim 1, wherein the reference read write circuit further comprises:
a reference read circuit that reads data held in the at least one of the plurality of memory cells, and outputs the reference voltage corresponding to the data; and
a reference write circuit that writes the data to the at least one of the plurality of memory cells.

7. The semiconductor device according to claim 6, wherein:
the at least one of the plurality of memory cells comprises a first memory cell that holds data of a first logic value, and a second memory cell that holds data of a second logic value;
the reference read circuit outputs a voltage at an intermediate level between a first signal read from the first memory cell and a second signal read from the second memory cell, wherein the voltage is output as the reference voltage; and
the reference write circuit writes data of each of the first and second logic values respectively to the first and second memory cells.

8. The semiconductor device according to claim 7, wherein the reference read write unit further comprises:

a first reference bit line connected to the first memory cell that holds data of the first logic value;
a second reference bit line connected to the second memory cell that holds data of the second logic value; and
first and second transistors connected in series between the first reference bit line and the second reference bit line; wherein
the reference voltage is output from a connection node of the first transistor and the second transistor.

9. The semiconductor device according to claim 6, further comprising:
a write control circuit that performs write control with regard to each of the respective memory cells;
wherein the write control circuit is configured to write an error-corrected data value to one or more of the respective memory cells, wherein the error-corrected data value corresponds to the data on which error correction has been performed based on the inverted control signal.

10. The semiconductor device according to claim 9, wherein the write control circuit comprises:
a rewrite node;
a precharge circuit that precharges the rewrite node to a prescribed potential; and
a third transistor having a gate that receives the inverted control signal, and in which one of a source and drain is connected to the rewrite node, and another of the source and drain is connected to a first power supply;
wherein the write control circuit performs control configured to write the error-corrected data value, based on the potential of the rewrite node.

11. The semiconductor device according to claim 1, further comprising:
a word line connected between a control electrode of each of the respective memory cells, and a control electrode of the at least one of the plurality of memory cells; wherein
the semiconductor device is configured such that the at least one of the plurality of memory cells that outputs the reference voltage is selected via the word line.

12. The semiconductor device according to claim 1, wherein:
data held by at least one of the respective memory cells is a data bit for external input/output, and
data held by at least one other of the respective memory cells is a check bit attached for error correction of the data bit.

13. The semiconductor device according to claim 12, further comprising an output buffer that outputs the data bit externally, wherein:
the ECC control block outputs the error signal in response to detecting error data exceeding error correction capability, and
the output buffer receives the error signal and performs control configured to prevent a data bit held by the respective memory cells from being output externally.

14. A semiconductor device comprising:
a plurality of memory cells including a plurality of first memory cells, a plurality of second memory cells, and a third memory cell;
a reference read write circuit coupled to the third memory cell and configured to generate a reference voltage in response to data stored in the third memory cell;
an error-correction code (ECC) control block configured to detect an error in data stored in the plurality of first and second memory cells, and to output an error signal when the ECC control block detects that it is unable to correct the error in the data stored in the plurality of first and second memory cells;

wherein the reference read write circuit is configured to rewrite data to the third memory cell in response to the error signal.

15. The semiconductor device of claim 14, wherein the reference read write circuit includes a reference node to which the reference voltage is supplied, wherein the plurality of memory cells further comprises a plurality of reference cells, wherein the plurality of reference cells includes the third memory cell and a fourth memory cell, wherein the third memory cell is coupled to the fourth memory cell via the reference node.

16. The semiconductor device of claim 15, wherein the third and fourth memory cells are controlled to store different data.

17. The semiconductor device of claim 16, wherein the third and fourth memory cells include resistance variable elements, respectively, and the resistance variable elements of the third and fourth memory cells are different in resistance value from each other.

18. The semiconductor device of claim 14, wherein the ECC control block further comprises:
a syndrome generation unit that generates a syndrome from the errors in the data of the plurality of first and second memory cells;
a syndrome decoder that identifies a location of data where an error has occurred among the plurality of first and second memory cells from the generated syndrome; and
an error correction unit that outputs an inverted control signal to invert, with regard to the data at the location identified by the syndrome decoder, a value of the data;

wherein the syndrome generated by the syndrome generation unit indicates that the error is present, and the ECC control block detects that the error exceeds error correction capability after performing error correction based on the inverted control signal output by the error correction unit.

19. The semiconductor device of claim 14, wherein the reference read write circuit further comprises:
a reference read circuit that reads data held in the at least one of the one or more third memory cells, and outputs the reference voltage corresponding to the data; and
a reference write circuit that writes the data to the at least one of the plurality of memory cells.

20. An apparatus comprising:
a reference read write circuit coupled to a first memory cell to generate a reference voltage in response to data stored in the first memory cell;
an error-correction code (ECC) control block configured to detect whether or not there is an error in data stored in one second memory cell of a plurality of second memory cells, and to output an error signal when the ECC control block detects that it is unable to correct the error in the data stored in the second memory cell;
wherein the reference read write circuit is configured to rewrite data to the first memory cell in response to the error signal.

* * * * *